(12) United States Patent
Kim et al.

(10) Patent No.: US 10,923,521 B2
(45) Date of Patent: Feb. 16, 2021

(54) FAN-OUT SENSOR PACKAGE AND CAMERA MODULE

(71) Applicant: SAMSUNG ELECTRONICS CO., LTD., Suwon-si (KR)

(72) Inventors: Byoung Chan Kim, Suwon-Si (KR); Yong Ho Baek, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/598,134

(22) Filed: Oct. 10, 2019

(65) Prior Publication Data
US 2020/0043970 A1  Feb. 6, 2020

Related U.S. Application Data

(63) Continuation of application No. 15/962,512, filed on Apr. 25, 2018, now Pat. No. 10,475,842.

(30) Foreign Application Priority Data

Nov. 7, 2017 (KR) .......................... 10-2017-0147249

(51) Int. Cl.
*H01L 27/146* (2006.01)
*H01L 23/48* (2006.01)
(Continued)

(52) U.S. Cl.
CPC .... *H01L 27/14636* (2013.01); *H01L 21/6835* (2013.01); *H01L 23/481* (2013.01);
(Continued)

(58) Field of Classification Search
CPC ......... H01L 27/14636; H01L 27/14618; H01L 23/562; H01L 23/481; H01L 24/11; H01L 24/32; H01L 24/29; H01L 24/83
(Continued)

(56) References Cited

U.S. PATENT DOCUMENTS 8,216,918 B2  7/2012 Gong et al.
8,536,672 B2  9/2013 Chang et al.
(Continued)

FOREIGN PATENT DOCUMENTS

KR  10-2017-0071826 A  6/2017
KR  10-2017-0121666 A  11/2017

OTHER PUBLICATIONS

Office Action issued in corresponding Korean Patent Application No. 10-2017-0147249, dated Aug. 17, 2018.

*Primary Examiner* — Dao H Nguyen
(74) *Attorney, Agent, or Firm* — Sughrue Mion, PLLC

(57) ABSTRACT

The fan-out sensor package includes: a core member having a through-hole; an integrated circuit (IC) for a sensor disposed in the through-hole and having a first surface having a sensor region and first connection pads disposed thereon, a second surface opposing the first surface and having second connection pads disposed thereon, and through-silicon vias (TSVs) penetrating between the first and second surfaces and electrically connecting the first and second connection pads to each other; an encapsulant covering the core member and the second surface of the IC for a sensor and filling at least portions of the through-hole; a redistribution layer disposed on the encapsulant; and vias penetrating through at least portions of the encapsulant and electrically connecting the redistribution layer and the second connection pads to each other.

11 Claims, 15 Drawing Sheets

(51) Int. Cl.
*H01L 23/31* (2006.01)
*H01L 23/00* (2006.01)
*H01L 21/683* (2006.01)

(52) U.S. Cl.
CPC ............ *H01L 23/562* (2013.01); *H01L 24/02* (2013.01); *H01L 24/11* (2013.01); *H01L 24/13* (2013.01); *H01L 24/29* (2013.01); *H01L 24/32* (2013.01); *H01L 24/83* (2013.01); *H01L 24/92* (2013.01); *H01L 27/14618* (2013.01); *H01L 27/14632* (2013.01); *H01L 27/14687* (2013.01); *H01L 23/3128* (2013.01); *H01L 2221/68345* (2013.01); *H01L 2221/68359* (2013.01)

(58) Field of Classification Search
USPC ............... 257/432, 433, 434, 448, 692, 777, 257/E23.023, E23.141, E23.174, E31.11, 257/E31.113; 438/464, 667, 109, 64
See application file for complete search history.

(56) References Cited

U.S. PATENT DOCUMENTS

| | | | |
|---|---|---|---|
| 8,598,695 | B2 | 12/2013 | Oganesian et al. |
| 9,258,922 | B2* | 2/2016 | Chen ................. H01L 23/49827 |
| 9,419,033 | B2 | 8/2016 | Hsu et al. |
| 9,431,442 | B2 | 8/2016 | Vittu |
| 9,698,071 | B2* | 7/2017 | Wang .................. H01L 21/4857 |
| 9,773,757 | B2* | 9/2017 | Yu ........................... H01L 24/32 |
| 9,852,998 | B2* | 12/2017 | Chen ................... H01L 21/4803 |
| 2008/0237836 | A1 | 10/2008 | Chia et al. |
| 2010/0032827 | A1 | 2/2010 | Hsu |
| 2010/0230803 | A1 | 9/2010 | Chien et al. |
| 2012/0217607 | A1 | 8/2012 | Hanai et al. |
| 2014/0183731 | A1* | 7/2014 | Lin ........................ H01L 24/97 |
| 2016/0104731 | A1 | 4/2016 | Chow et al. |
| 2016/0322282 | A1 | 11/2016 | Aoyagi et al. |
| 2017/0345807 | A1* | 11/2017 | Yu ........................... H01L 24/20 |

* cited by examiner

I-I'

FAN-OUT SENSOR PACKAGE AND CAMERA MODULE

CROSS-REFERENCE TO RELATED APPLICATION(S)

This application is a Continuation application of U.S. patent application Ser. No. 15/962,512, filed on Apr. 25, 2018 which claims the benefit of priority to Korean Patent Application No. 10-2017-0147249 filed on Nov. 7, 2017 in the Korean Intellectual Property Office, the disclosures of which are incorporated herein by reference in their entireties.

TECHNICAL FIELD

The present disclosure relates to a fan-out sensor package in which an integrated circuit (IC) for an image sensor is packaged in fan-out form, and a camera module including the same.

BACKGROUND

In a technology of packaging devices used in mobile products such as smartphones or tablet personal computers (PC), miniaturization and performance improvements of the devices have been continuously demanded. That is, efforts to manufacture a package having a small size and to add more functions in the same space have been conducted. Particularly, demand for miniaturization of components having additional functions rather than a main component has increased. For example, demand for miniaturization and performance improvements of an image sensor package used in a camera module, or the like, has increased.

SUMMARY

An aspect of the present disclosure may provide a fan-out sensor package by which miniaturization and performance improvements are possible and in which a process of implementing a module or a device may be simplified, and a camera module including the same.

According to an aspect of the present disclosure, a fan-out sensor package may be provided, in which a core member having a through-hole is disposed, a sensor is disposed in the through-hole of the core member and is then encapsulated by an encapsulant, the sensor is encapsulated by the encapsulant so that a sensor region may be exposed at a first surface of the encapsulant, and a redistribution layer is formed on a second surface of the encapsulant opposing the first surface of the encapsulant, the redistribution layer being connected to the sensor.

According to an aspect of the present disclosure, a fan-out sensor package may include: a core member having a through-hole; an integrated circuit (IC) for a sensor disposed in the through-hole, the IC having a first surface having a sensor region and first connection pads disposed thereon, a second surface opposing the first surface and having second connection pads disposed thereon, and through-silicon vias (TSVs) penetrating between the first and second surfaces and electrically connecting the first and second connection pads to each other; an encapsulant covering the core member and the second surface of the IC and filling at least portions of the through-hole; a redistribution layer disposed on the encapsulant; and vias penetrating through at least portions of the encapsulant and electrically connecting the redistribution layer and the second connection pads to each other.

According to another aspect of the present disclosure, a camera module may include: a circuit board; an image sensor package disposed on the circuit board; and a lens member disposed on the image sensor package, wherein the image sensor package is the fan-out sensor package as described above.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out sensor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
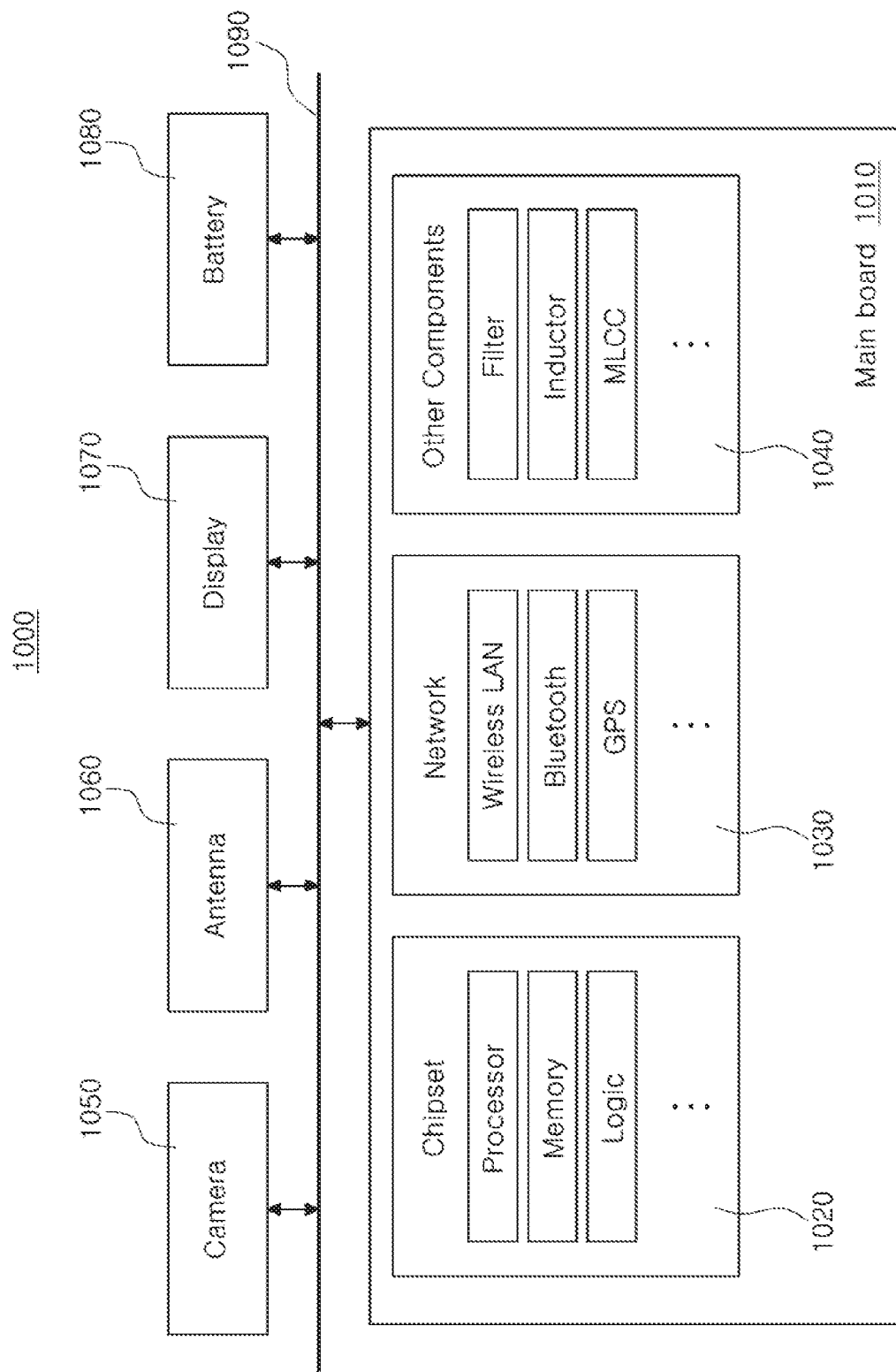
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
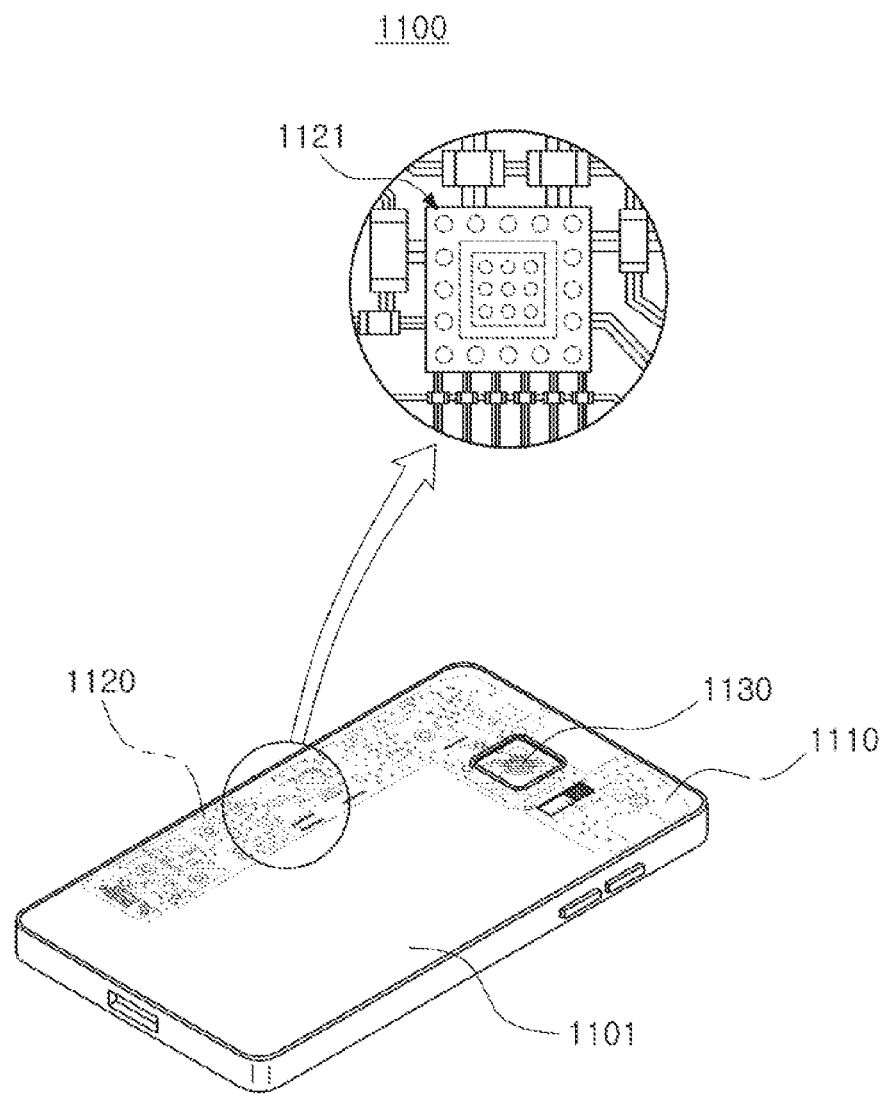
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in a body 1101 of the smartphone 1100, and various electronic components 1120 such as a semiconductor package 1121 may be physically or electrically connected to the mainboard 1110. In addition, other components that may or may not be physically or electrically connected to the mainboard 1110, such as the camera module 1130, may be accommodated in the body 1101. The camera module 1130 may include an image sensor package, and a fan-out sensor package according to the present disclosure may be used in the smartphone. Meanwhile, the electronic device in which the fan-out sensor package according to the present disclosure is used is not limited to the smartphone 1100. That is, the fan-out sensor package according to the present disclosure may also be used in other electronic devices.

Semiconductor Package

A fan-out sensor package according to the present disclosure may be manufactured using technology of a semiconductor package. Generally, numerous fine electrical circuits are integrated in a semiconductor. However, the semiconductor may not serve as a finished semiconductor product in itself, and may be damaged due to external physical or chemical impacts. Therefore, the semiconductor itself may not be used, but may be packaged and used in an electronic device, or the like, in a packaged state.

Here, semiconductor packaging is required due to the existence of a difference in a circuit width between the semiconductor and a mainboard of the electronic device in terms of electrical connections. In detail, a size of connection pads of the semiconductor and an interval between the connection pads of the semiconductor are very fine, but a size of component mounting pads of the mainboard and an interval between the component mounting pads of the mainboard are significantly larger than those of the semiconductor. Therefore, it may be difficult to directly mount the semiconductor on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
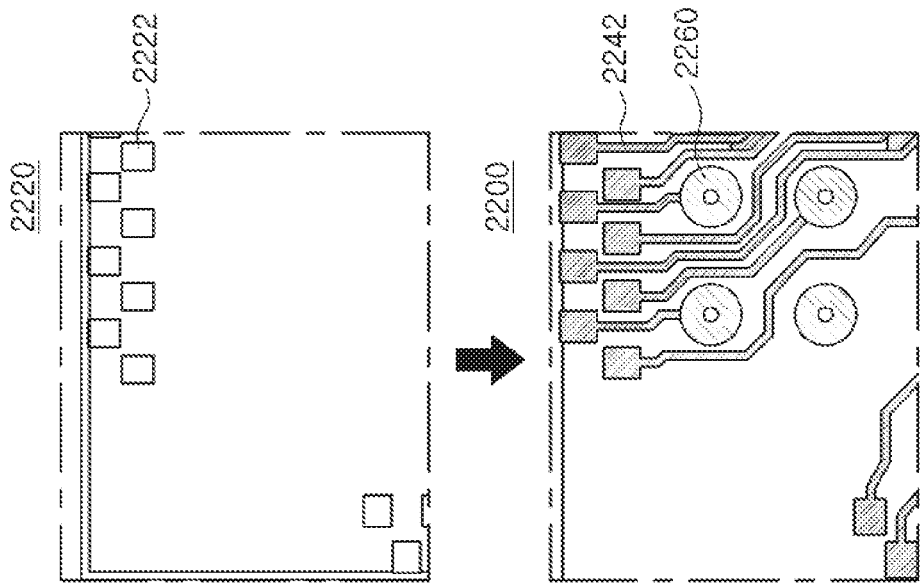
FIGS. 3A and 3B are schematic cross-sectional views illustrating states of a fan-in semiconductor package before and after being packaged.
Figure 3A:
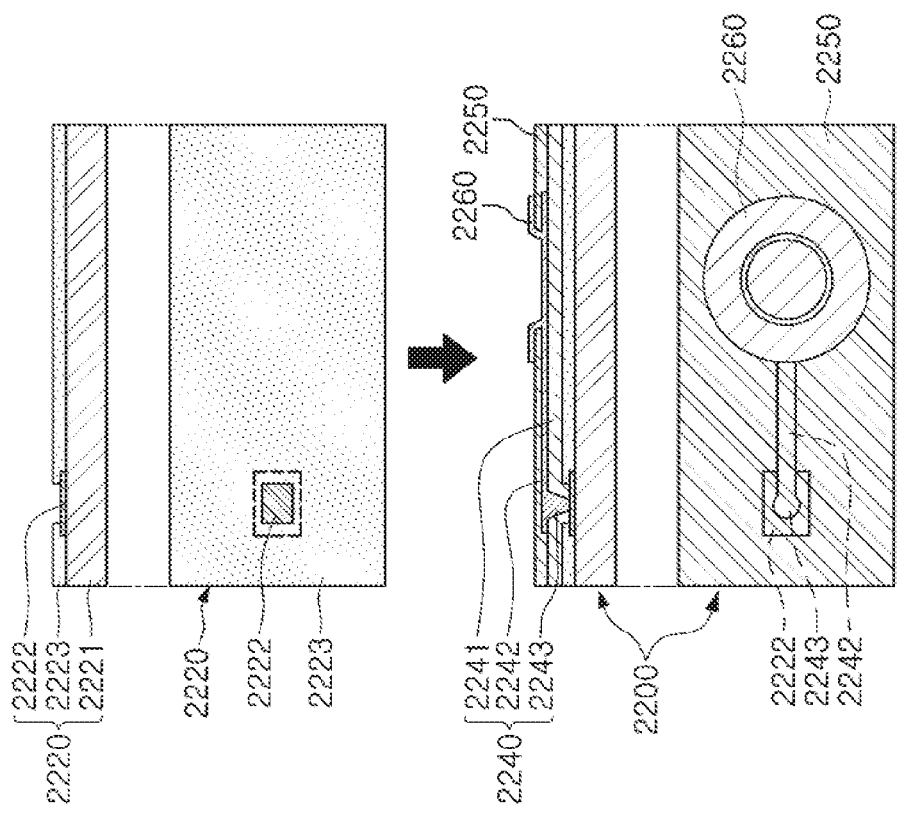

FIGS. 3A and 3B are schematic cross-sectional views illustrating states of a fan-in semiconductor package before and after being packaged.

Figure 4:
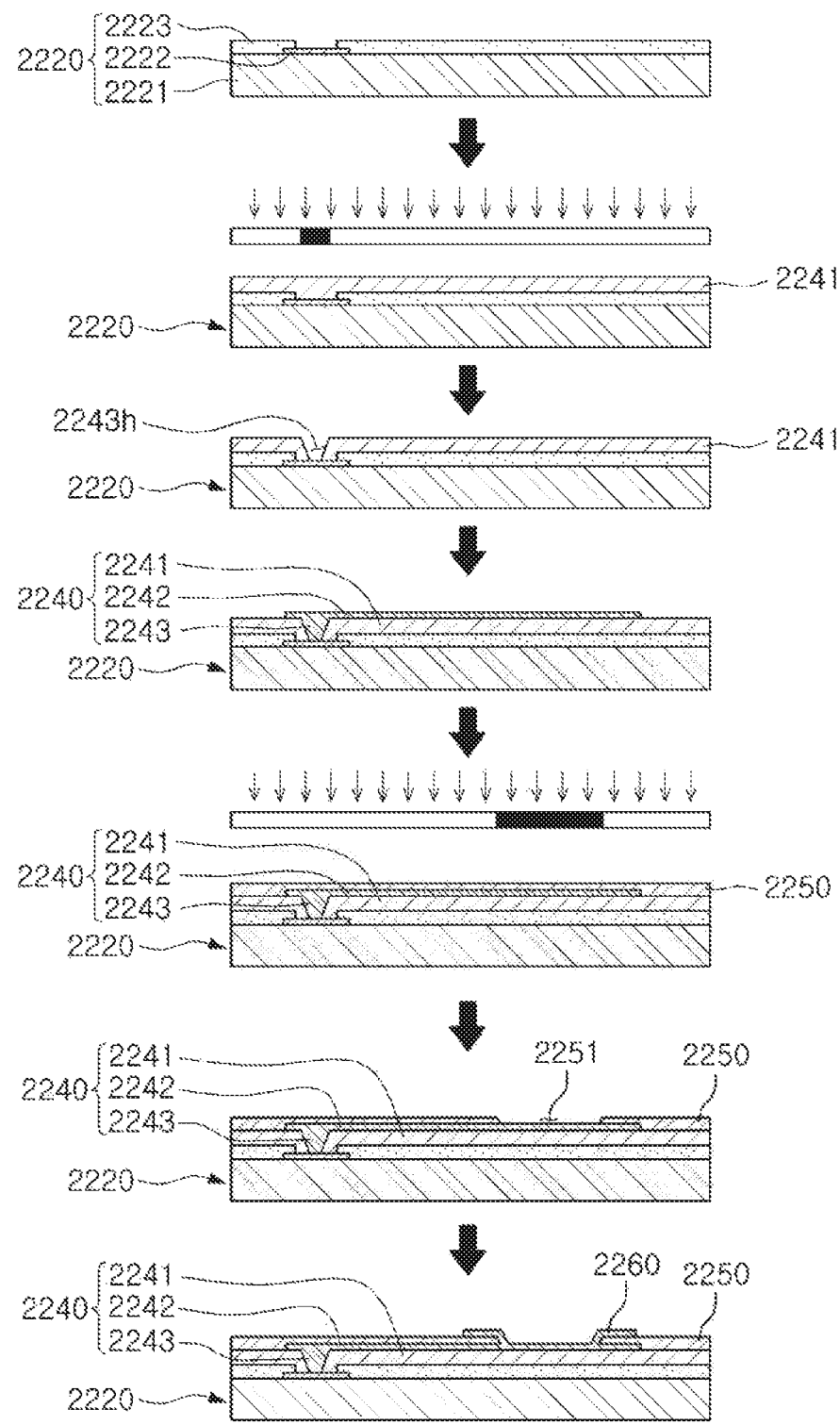
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor are disposed inside the semiconductor, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor in the fan-in semiconductor package, the fan-in semiconductor package has significant spatial limitations. Therefore, it is difficult to apply this structure to a semiconductor having a large number of I/O terminals or a semiconductor having a compact size. In addition, due to the disadvantage described above, the fan-in semiconductor package may not be directly mounted and used on the mainboard of the electronic device. The reason is that even in the case in which a size of the I/O terminals of the semiconductor and an interval between the I/O terminals of the semiconductor are increased by a redistribution process, the size of the I/O terminals of the semiconductor and the interval between the I/O terminals of the semiconductor may not be sufficient to directly mount the fan-in semiconductor package on the main board of the electronic device.

Figure 5:
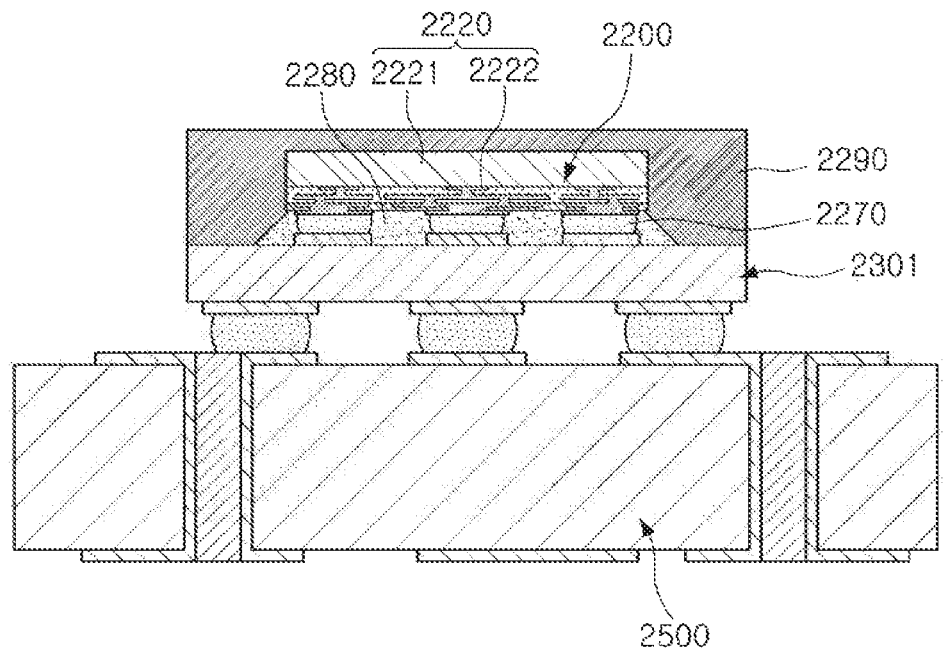
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
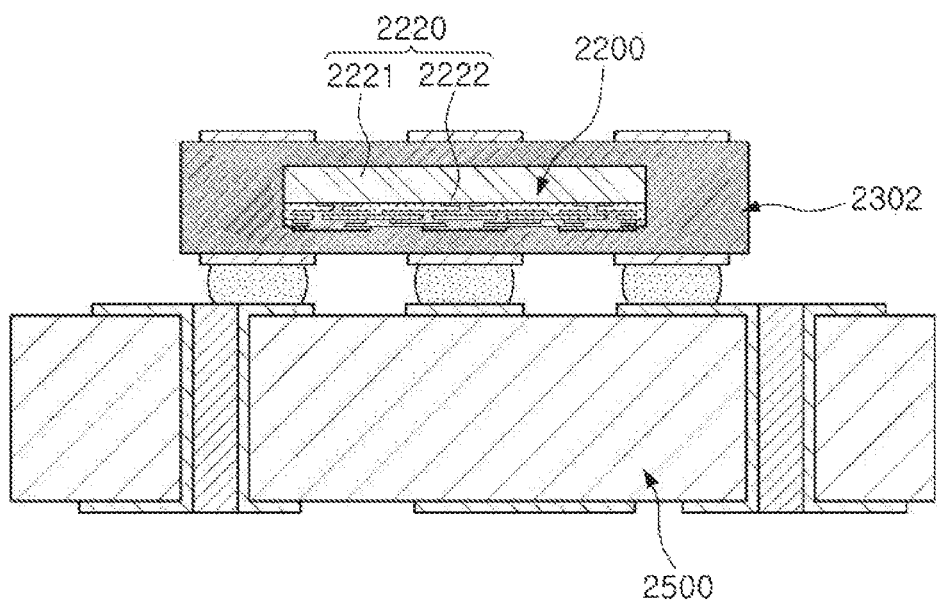
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
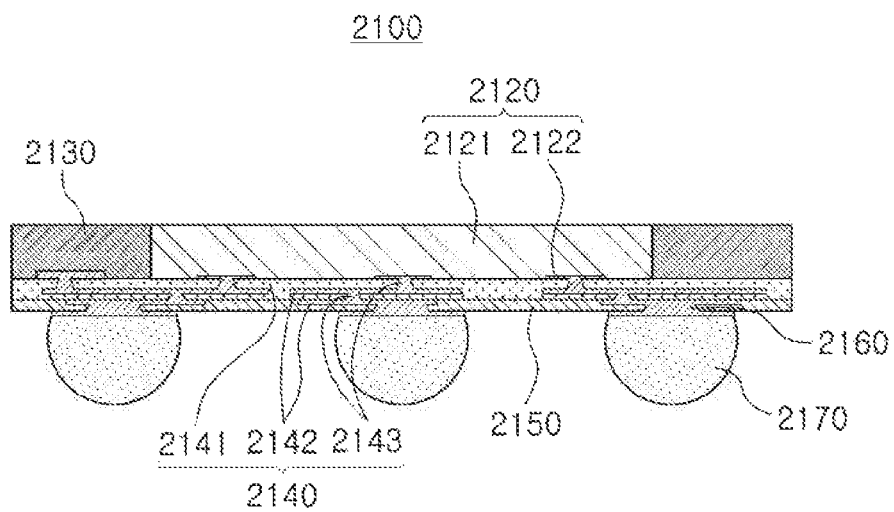
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor are redistributed and disposed outwardly of the semiconductor through the connection member formed on the semiconductor. As described above, in the fan-in semiconductor package, all I/O terminals of the semiconductor need to be disposed inside the semiconductor. Therefore, when a size of the semiconductor is decreased, a size and a pitch of balls need to be decreased, such that a standardized ball layout may not be used in the fan-in semiconductor package. On the other hand, the fan-out semiconductor package has the form in which the I/O terminals of the semiconductor are redistributed and disposed outwardly of the semiconductor through the connection member formed on the semiconductor as described above. Therefore, even in the case in which a size of the semiconductor is decreased, a standardized ball layout may be used in the fan-out semiconductor package as it is, such that the fan-out semiconductor package may be mounted on the mainboard of the electronic device without using a separate BGA substrate, as described below.

Figure 8:
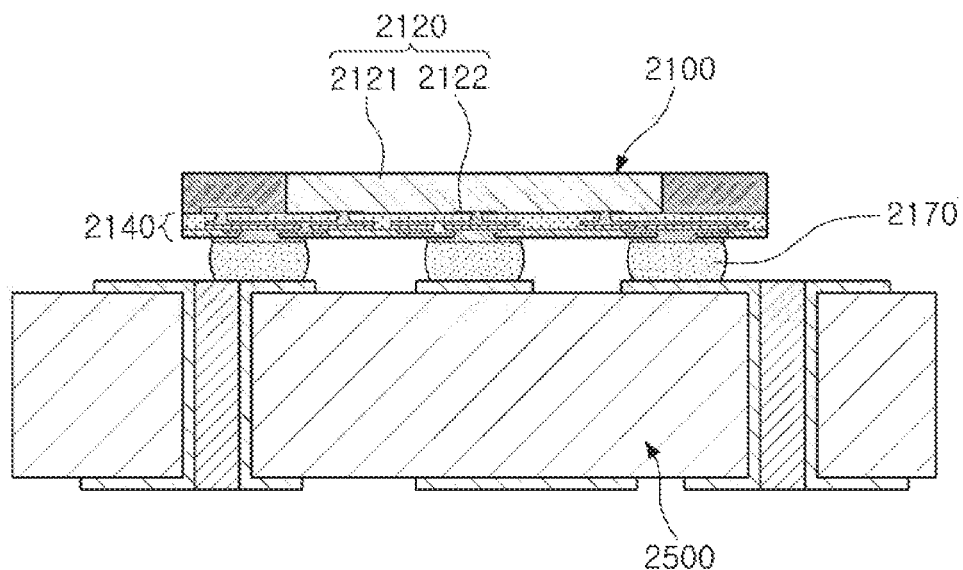
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor on the mainboard of the electronic device, or the like, as described above, and protecting the semiconductor from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out sensor package according to the present disclosure may be manufactured using the fan-out semiconductor package technology described above. A fan-out sensor package according to the present disclosure will hereinafter be described with reference to the drawings.

Figure 9:
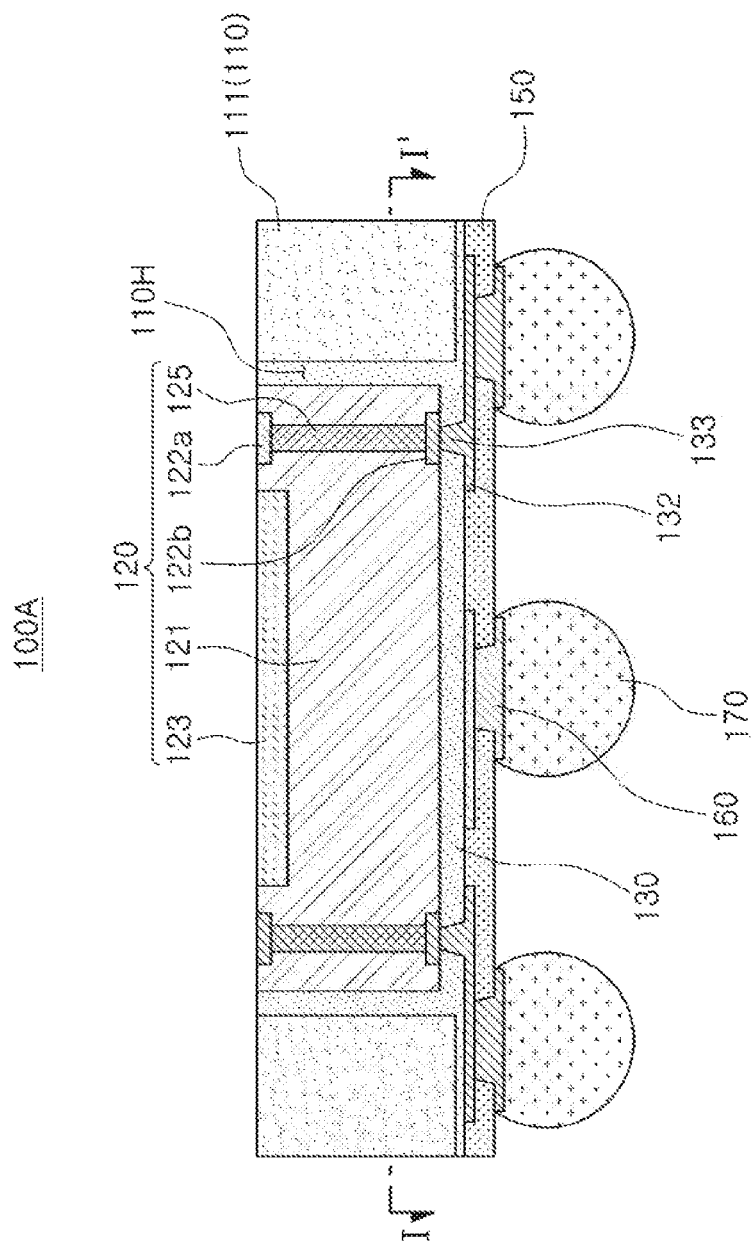
FIG. 9 is a schematic cross-sectional view illustrating an example of a fan-out sensor package.

FIG. 9 is a schematic cross-sectional view illustrating an example of a fan-out sensor package.

Figure 10:
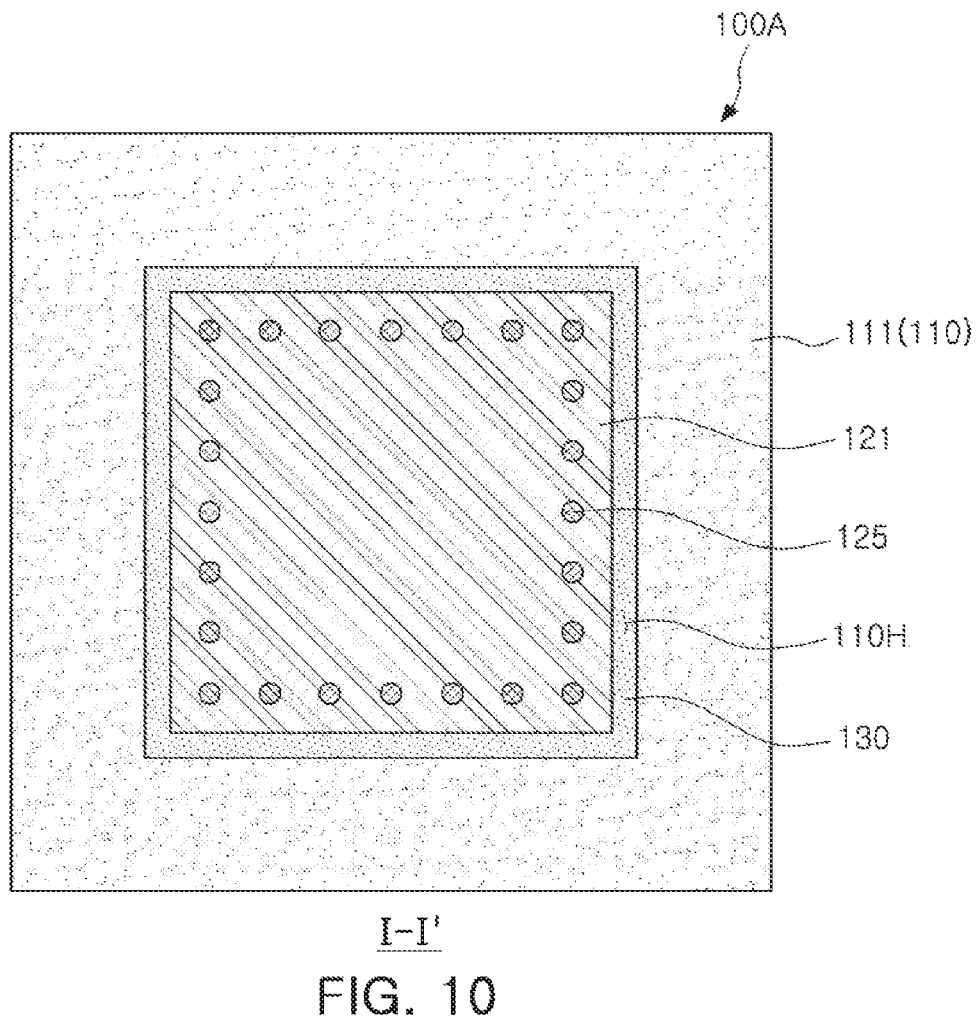
FIG. 10 is a schematic plan view taken along line I-I' of the fan-out sensor package of FIG. 9.

FIG. 10 is a schematic plan view taken along line I-I' of the fan-out sensor package of FIG. 9.

Figure 11:
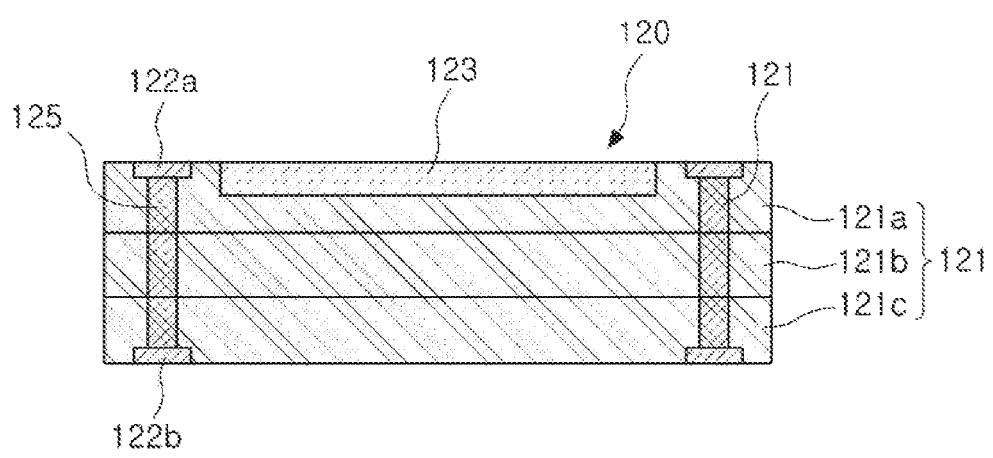
FIG. 11 is a schematic cross-sectional view illustrating an example of an integrated circuit (IC) for a sensor of the fan-out sensor package of FIG. 9.

FIG. 11 is a schematic cross-sectional view illustrating an example of an integrated circuit (IC) for a sensor of the fan-out sensor package of FIG. 9.

Referring to FIGS. 9 through 11, a fan-out sensor package 100A according to an exemplary embodiment in the present disclosure may include a core member 110 having a through-hole 110H, and an IC 120 for a sensor disposed in the through-hole 110H. The IC has a first surface having a sensor region 123 and first connection pads 122a disposed thereon, a second surface opposing the first surface and having second connection pads 122b disposed thereon, and through-silicon vias (TSVs) 125 penetrating between the first and second surfaces and electrically connecting the first and second connection pads 122a and 122b to each other. The package 100A may further include an encapsulant 130 covering the core member 110 and the second surface of the IC 120 for a sensor and filling at least portions of the through-hole 110H, a redistribution layer 132 disposed on the encapsulant 130, and vias 133 penetrating through at least portions of the encapsulant 130 and electrically connecting the redistribution layer 132 and the second connection pads 122b to each other. If necessary, the fan-out sensor package 100A may further include a passivation layer 150 disposed on the encapsulant 130 to cover the redistribution layer 132 and having openings exposing at least portions of the redistribution layer 132, an underbump metal layer 160 disposed in the openings of the passivation layer 150 and connected to the exposed redistribution layer 132, and electrical connection structures 170 disposed on the passivation layer 150 and connected to the underbump metal layer 160. The sensor region 123 of the IC 120 for a sensor may be exposed upwardly of the fan-out sensor package 100A.

In general, an image sensor package according to the related art is manufactured by attaching an image sensor to a printed circuit board or a ceramic board using an adhesive, or the like, interconnecting the image sensor and the printed circuit board using wire bonding technology, and protecting the image sensor by a housing. In the image sensor package having the structure described above, it is difficult to reduce a thickness of the printed circuit board or the ceramic board, such that there is a limitation in thinness of the image sensor package, and it is difficult to sufficiently utilize a space due to the interconnection of the image sensor and the printed circuit board through the wire bonding technology, such that there is a limitation in miniaturization and performance improvement of the image sensor package. In addition, a rigid-flexible printed circuit board (RFPCB) is required as the printed circuit board and wire bonding is forced, and a process of implementing a module is thus complicated.

On the other hand, in the fan-out sensor package 100A according to the exemplary embodiment, the core member 110 having the through-hole 110H may be introduced, and the IC 120 for a sensor may be disposed in the through-hole 110H. In this case, the encapsulant 130 may encapsulate the IC 120 for a sensor so as not to cover the sensor region 123 of the IC 120 for a sensor, the redistribution layer 132 may be introduced on the other surface of the encapsulant 130 opposing one surface of the encapsulant 130 on which the sensor region 123 is exposed, and the TSVs 125 may be formed in the IC 120 for a sensor to promote an electrical connection to the redistribution layer 132. Therefore, miniaturization and thinness of the fan-out sensor package 100A may be promoted, and performance of the fan-out sensor package 100A may be improved by securing a short signal path and sensing capability through exposure of the sensor region 123. In addition, due to the introduction of the core member 110, or the like, a flexible printed circuit board (FPCB) may be used, and the wire bonding is not forced, such that a module may be more easily manufactured. The FPCB may have a thickness significantly smaller than that of the RFPCB, and the module may thus be thinned. In addition, the fan-out sensor package 100A according to the exemplary embodiment may be used in an optical fingerprint sensor device as well as a camera module. In this case, a reduction in a sensing distance, which is a key point of the fingerprint sensor device, is possible due to exposure of the sensor region 123. Resultantly, a fingerprint sensor recognition rate may be improved, and the fingerprint sensor device may be simply implemented, such that a cost reduction is possible.

The respective components included in the fan-out sensor package 100A according to the exemplary embodiment will hereinafter be described below in more detail.

The core member 110 may improve rigidity of the fan-out sensor package 100A depending on certain materials, and serve to secure uniformity of a thickness of the encapsulant 130. The core member 110 may have the through-hole 110H. The IC 120 for a sensor may be disposed in the through-hole 110H to be spaced apart from the core member 110 by a predetermined distance. Side surfaces of the IC 120 for a sensor may be surrounded by the core member 110. A space between the core member 110 and the IC 120 for a sensor in the through-hole 110H may be filled by the encapsulant 130, and the IC 120 for a sensor may thus be surrounded by an insulating material, such that stability may be secured. However, such a form is only an example and may be variously modified to have other forms, and the core member 110 may perform another function depending on such a form.

A material of an insulating layer 111 constituting the core member 110 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. Particularly, when prepreg including a glass fiber, an inorganic filler, and an insulating resin is used as the material of the insulating layer 111, rigidity of the fan-out sensor package 100A may be maintained.

The IC 120 for a sensor may be an IC for an image sensor such as a complementary metal oxide semiconductor (CMOS) sensor type, a charge coupled device (CCD) sensor type, or the like, used in a camera module, or the like, but is not limited thereto. The IC 120 for a sensor may include a body 121, the connection pads 122a and 122b, the sensor region 123, and the TSVs 125. A base material of the body 121 may be silicon (Si), germanium (Ge), gallium arsenide (GaAs), or the like. Various circuits may be formed on the body 121. That is, the IC 120 for a sensor may be an IC die manufactured by a wafer process. In this case, the IC 120 for a sensor may have a stack die form in which a sensor die 121a, a logic die 121b, and a memory die 121c are sequentially stacked, as illustrated in FIG. 11, and the sensor die 121a, the logic die 121b, and the memory die 121c may be electrically connected to each other through the TSVs. In addition, the first connection pads 122a and the sensor region 123 may be disposed on one surface of the sensor die 121a, and the second connection pads 122b may be disposed on one surface of the memory die 121c. The sensor die 121a may be the CMOS, the CCD, or the like, described above, the logic die 121b may be an application specific IC (ASIC), and the memory die 121c may be a DRAM, or the like. However, the sensor die 121a, the logic die 121b, and the memory die 121c are not limited thereto. The connection pads 122a and 122b may electrically connect the IC 120 for a sensor to other components. A material of each of the connection pads 122a and 122 may be a conductive material such as aluminum (Al), copper (Cu), or the like. The TSVs 125 may be general TSVs. The sensor region 123 may be an image sensor region that may receive image information when the IC 120 for a sensor is an image sensor, and a fingerprint sensor region having fingerprint recognition patterns such as Rx, Tx, and the like, when the IC 120 for a sensor is a fingerprint sensor.

An upper surface of the core member 110 and a surface of the IC 120 for a sensor on which the sensor region 123 is disposed may be disposed on the same level. The term "the same level" does not mean that levels are completely the same as each other, but means that a case in which a fine difference by a process exists is included. The reason is that the upper surface of the core member 110 and the surface of the IC 120 for a sensor on which the sensor region 123 is disposed are encapsulated by the encapsulant 130 in a state in which they are attached together to an adhesive film 190, as seen from a process to be described below.

The encapsulant 130 may protect the core member 110, the IC 120 for a sensor, and the like. An encapsulation form of the encapsulant 130 is not particularly limited, but may be a form in which the encapsulant 130 surrounds at least portions of the core member 110, the IC 120 for a sensor, and the like. For example, the encapsulant 130 may cover at least portions of a lower surface of each of the core member 110 and the IC 120 for a sensor, and fill spaces between walls of the through-hole 110H and the side surfaces of the IC 120 for a sensor. Meanwhile, the encapsulant 130 may fill the through-hole 110H to thus serve as an adhesive and reduce buckling of the IC 120 for a sensor depending on certain materials.

A material of the encapsulant 130 is not particularly limited. For example, the material of the encapsulant 130 may be prepreg including an insulating resin, a core material, a filler, and the like, or may be ABF including an insulating resin and a filler. If necessary, the material of the encapsulant 130 may be a photoimagable encapsulant (PIE) including a photosensitive insulating material. When the PIE is used as the material of the encapsulant 130, vias 143 to be described below may be formed in a fine pitch.

The redistribution layer 132 may serve to redistribute the connection pads 122a and 122b, and a material of the redistribution layer 132 may be a conductive material such as copper (Cu), aluminum (Al), silver (Ag), tin (Sn), gold (Au), nickel (Ni), lead (Pb), titanium (Ti), or alloys thereof. The redistribution layer 132 may perform various functions depending on a design of a corresponding layer. For example, the redistribution layer 132 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 132 may include via pads, electrical connection structures pads, and the like.

A surface treatment layer (not illustrated) may be formed on an exposed surface of the redistribution layer 132, if necessary. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The vias 133 may electrically connect the redistribution layer 132, the second connection pads 122b, and the like, formed on different layers to each other, resulting in an electrical path in the fan-out sensor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 133 may have any shape known in the related art such as a tapered shape.

Meanwhile, although not illustrated in detail in the drawings, the redistribution layer 132 and the vias 133 may also be implemented in a multilayer form having a larger number of layers. In this case, a separate insulating layer such as a PID or an ABF may further be stacked on the encapsulant 130. That is, a larger number of redistribution layers 132 and vias 133 may be formed depending on a wiring design.

The passivation layer 150 may be additionally configured to protect the redistribution layer 132 from external physical or chemical damage. The passivation layer 150 may have the openings exposing at least portions of the redistribution layer 132. The number of openings formed in the passivation layer 150 may be several tens to several thousands. A material of the passivation layer 150 is not particularly limited. For example, the material of the passivation layer 150 may be prepreg including an insulating resin, a core material, a filler, and the like, or may be ABF including an insulating resin and a filler. Alternatively, any known solder resist may be used as the material of the passivation layer 150.

The underbump metal layer 160 may be additionally configured to improve connection reliability of the electrical connection structures 170 to improve board level reliability of the fan-out sensor package 100A. The underbump metal layer 160 may be connected to the redistribution layer 132 exposed through the openings of the passivation layer 150. The underbump metal layer 160 may be formed in the openings of the passivation layer 150 by any known metallization method using any known conductive material such as a metal, but is not limited thereto.

The electrical connection structure 170 may be additionally configured to physically or electrically externally connect the fan-out sensor package 100A. For example, the fan-out sensor package 100A may be mounted on the mainboard of the electronic device through electrical connection structures 170. Each of the electrical connection structures 170 may be formed of a low melting point metal, for example, a solder including tin (Sn). However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several millions according to the number of connection pads 122, or may be provided in an amount of several tens to several millions or more or several tens to several millions or less. When the electrical connection structures 170 are solder balls, the electrical connection structures 170 may cover side surfaces of the underbump metal layer 160 extending onto one surface of the passivation layer 150, and connection reliability may be more excellent.

At least one of the electrical connection structures 170 may be disposed in a fan-out region. The fan-out region refers to a region except for the region in which the IC 120 for a sensor is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, a metal thin film may be formed on the walls of the through-hole 110H, if necessary, in order to dissipate heat or block electromagnetic waves. In addition, a plurality of ICs 120 for a sensor performing functions that are the same as or different from each other may be disposed in the through-hole 110H. In addition, another semiconductor chip such as an application specific integrated circuit (ASIC), or the like, may be disposed in the through-hole 110H. In addition, a passive component may be disposed in the through-hole 110H, and may be electrically connected to the IC 120 for a sensor through the redistribution layer 132. In addition, a separate surface mounting component may be disposed on a surface of the passivation layer 150.

FIGS. 12A through 12D are schematic views illustrating an example of processes of manufacturing the fan-out sensor package of FIG. 9.

Figure 12A:
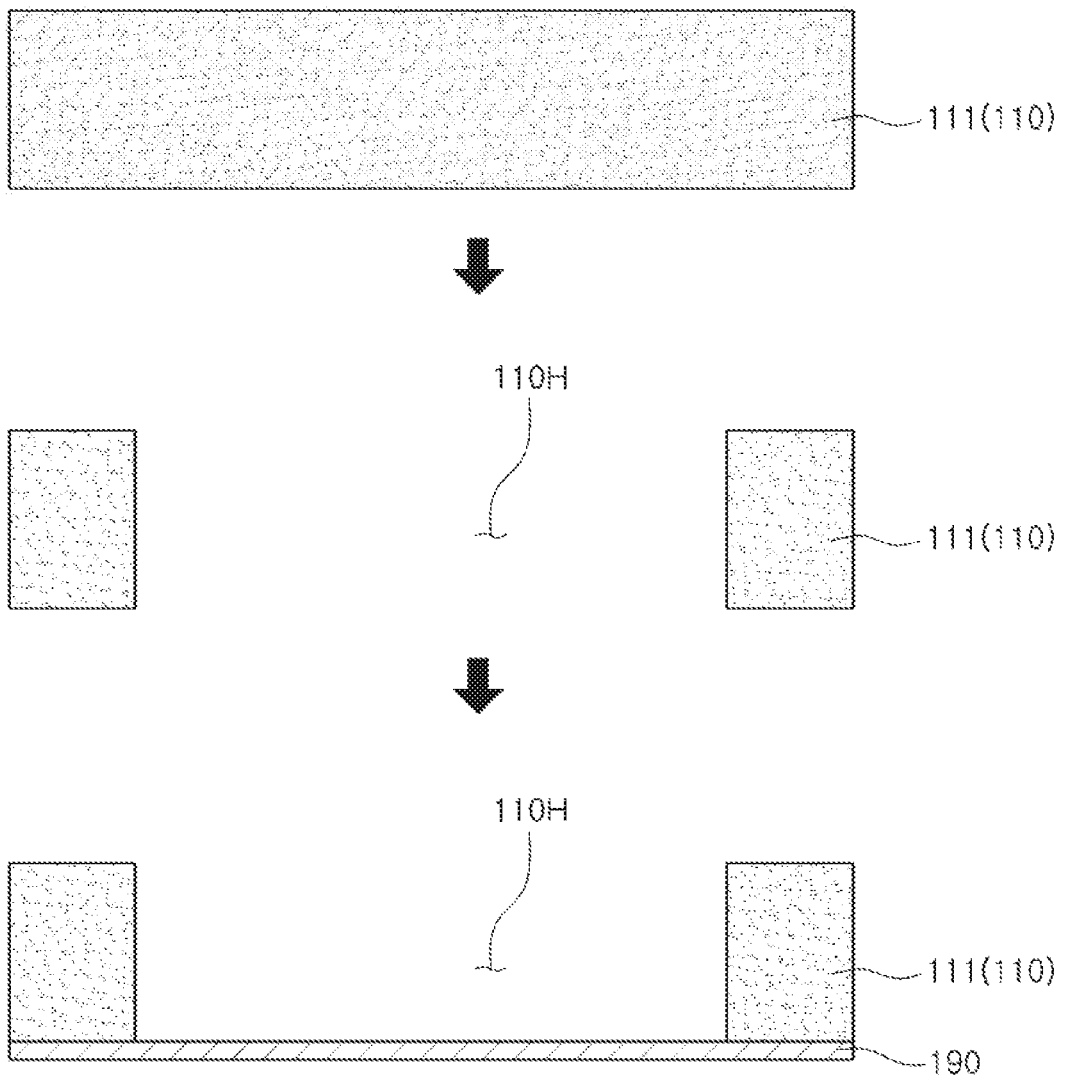
FIGS. 12A through 12D are schematic views illustrating an example of processes of manufacturing the fan-out sensor package of FIG. 9.

Referring to FIG. 12A, the core member 110 may be first prepared. The core member 110 may be prepared using an unclad copper clad laminate (CCL). Then, the through-hole 110H may be formed in the core member 110. The through-hole 110H may be formed using laser drilling and/or mechanical drilling or be formed by sandblasting. Then, an adhesive film 190 may be attached to a lower surface of the core member 110. The adhesive film 190 may be any known tape including an epoxy resin, or the like.

Figure 12B:
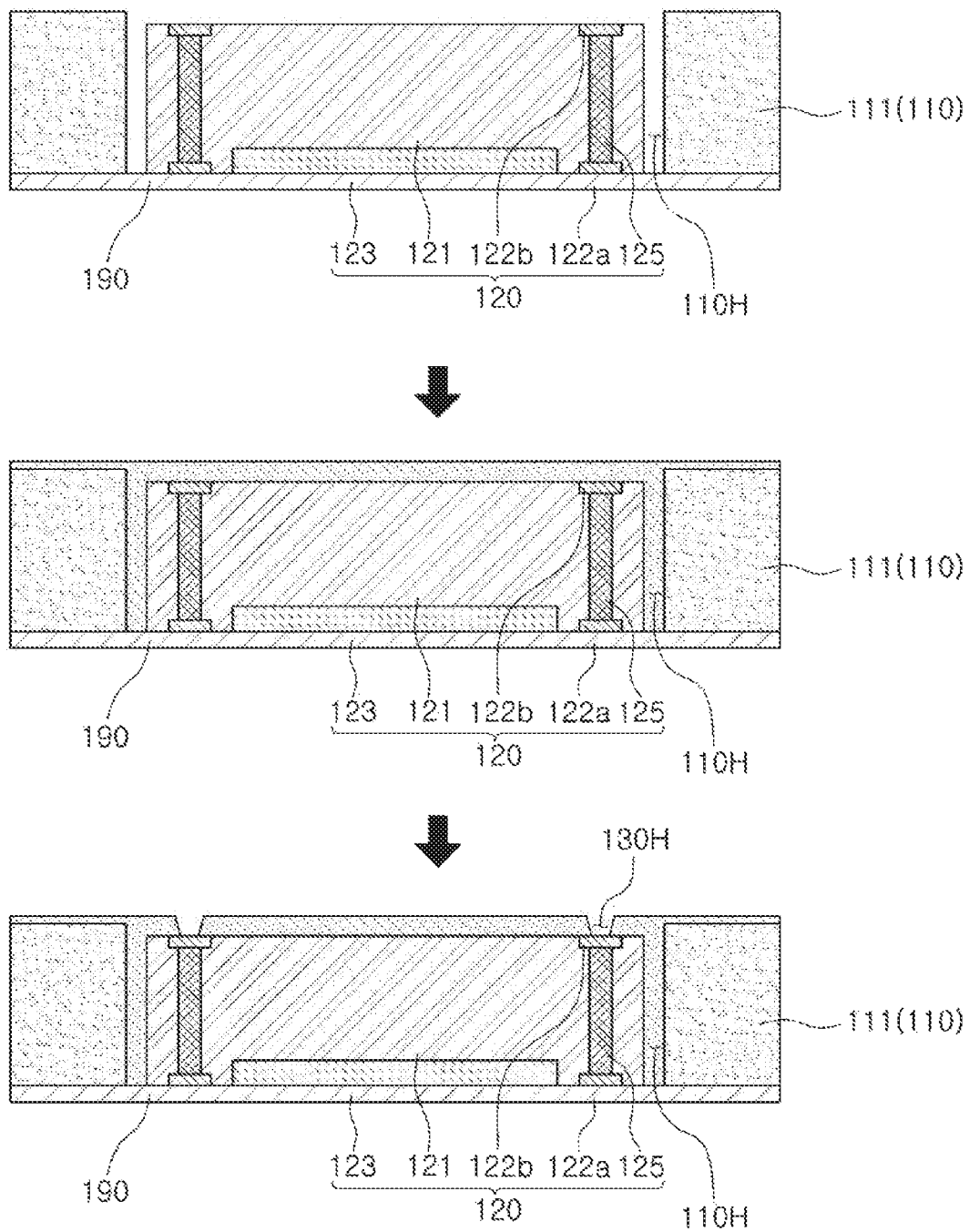

Then, referring to FIG. 12B, the IC 120 for a sensor may be attached to a portion of the adhesive film 190 exposed through the through-hole 110H. The IC 120 for a sensor may be prepared by stacking and then dicing the manufactured sensor die 121a, logic die 121b, and memory die 121c on the wafer, as described above. The IC 120 for a sensor may be disposed so that the first surface thereof on which the first connection pads 122a and the sensor region 123 are disposed is attached to the adhesive film 190. Then, the IC 120 for a sensor may be encapsulated using the encapsulant 130. The encapsulant 130 may be formed by any known lamination method or an applying and hardening method. Then, via holes 130H may be formed in the encapsulant 130 using the second connection pads 122b as stoppers. The via holes 130H may be formed by a photolithography method when the encapsulant 130 includes a photosensitive insulating material, and may be formed by a laser method when the encapsulant 130 includes a non-photosensitive insulating material.

Figure 12C:
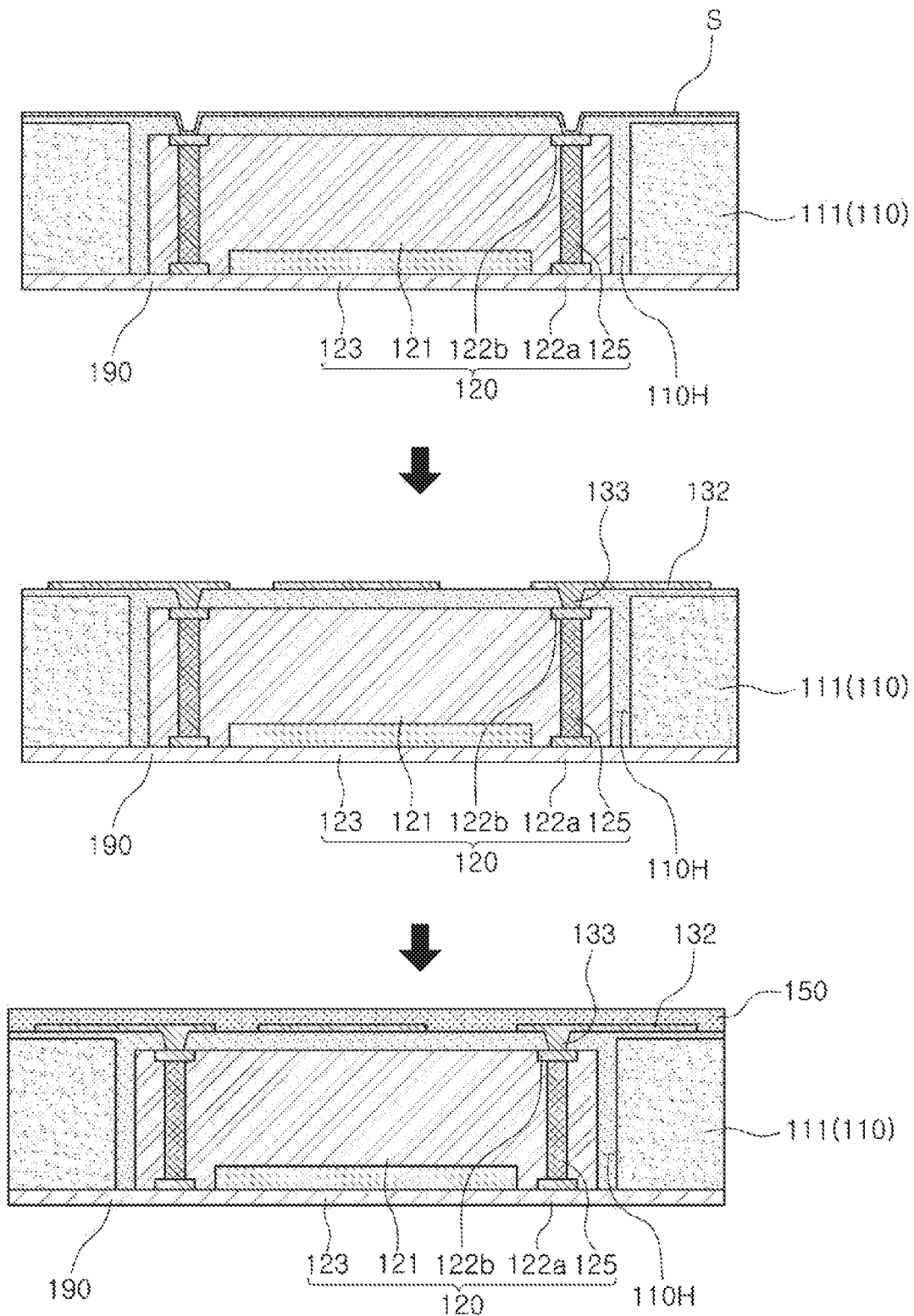

Then, referring to FIG. 12C, a seed layer S may be formed using sputtering, chemical copper plating, or the like. Then, patterning may be attempted using a dry film (not illustrated), or the like, a plating process such as electroplating, electroless plating, or the like, may be performed using the seed layer s, and the seed layer s remaining in a region in which patterns are not formed may be removed by an etching process. Resultantly, the redistribution layer 132 and the vias 133 may be formed. Then, the passivation layer 150 covering the redistribution layer 132 may be formed on the encapsulant 130 by a lamination method or an applying and hardening method, if necessary.

Figure 12D:
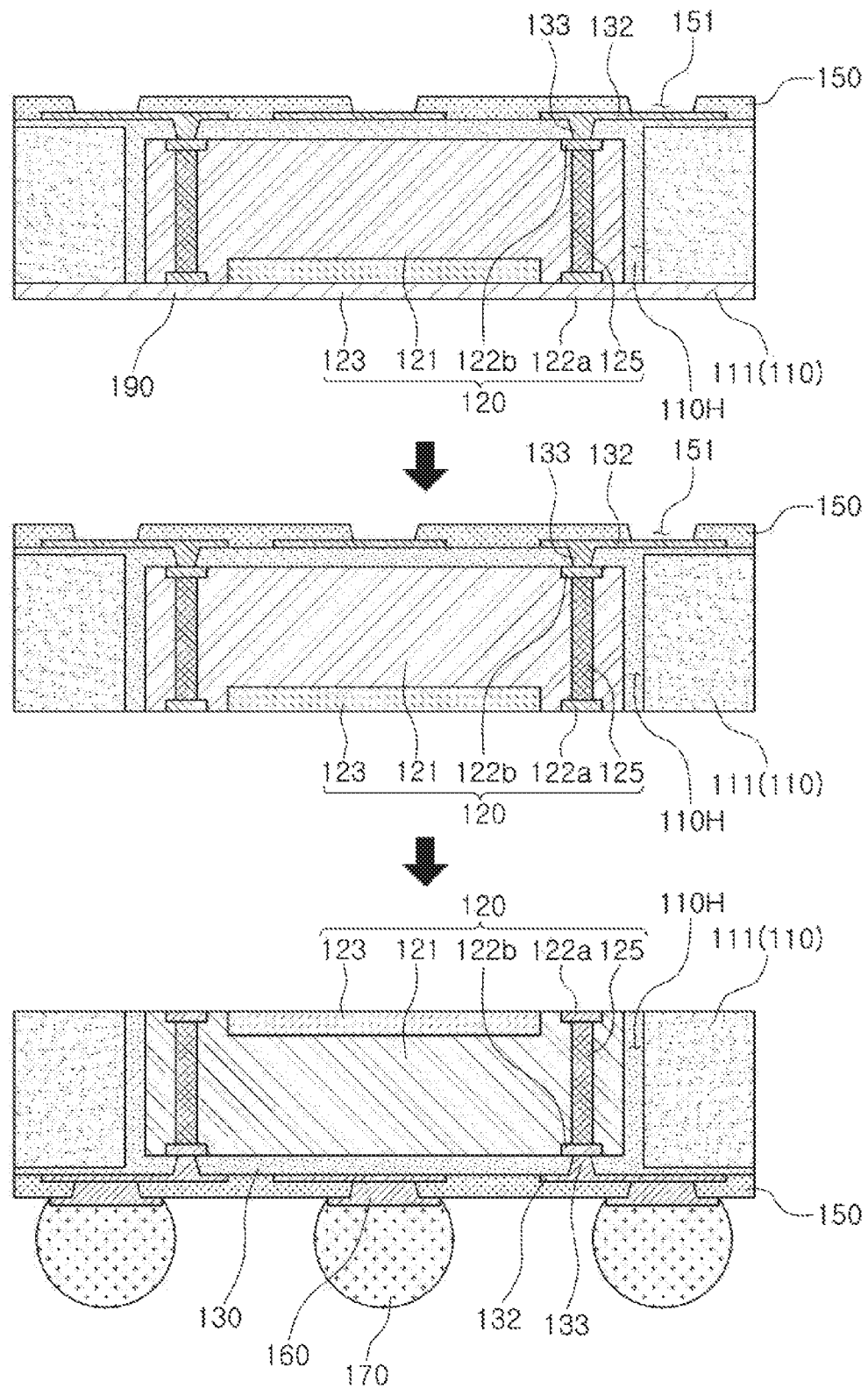

Then, referring to FIG. 12D, the openings 151 exposing at least portions of the redistribution layer 132 may be formed in the passivation layer 150, if necessary. The openings 151 may be formed using laser drilling, but may also be formed by a photolithography method depending on a material of the passivation layer 150. Then, the adhesive film 190 may be removed. Then, the underbump metal layer 160 and the electrical connection structures 170 may be formed, if necessary. A series of processes may be performed on a panel level. In this case, when a singulation process is performed, a plurality of fan-out sensor packages 100A may be obtained.

Figure 13:
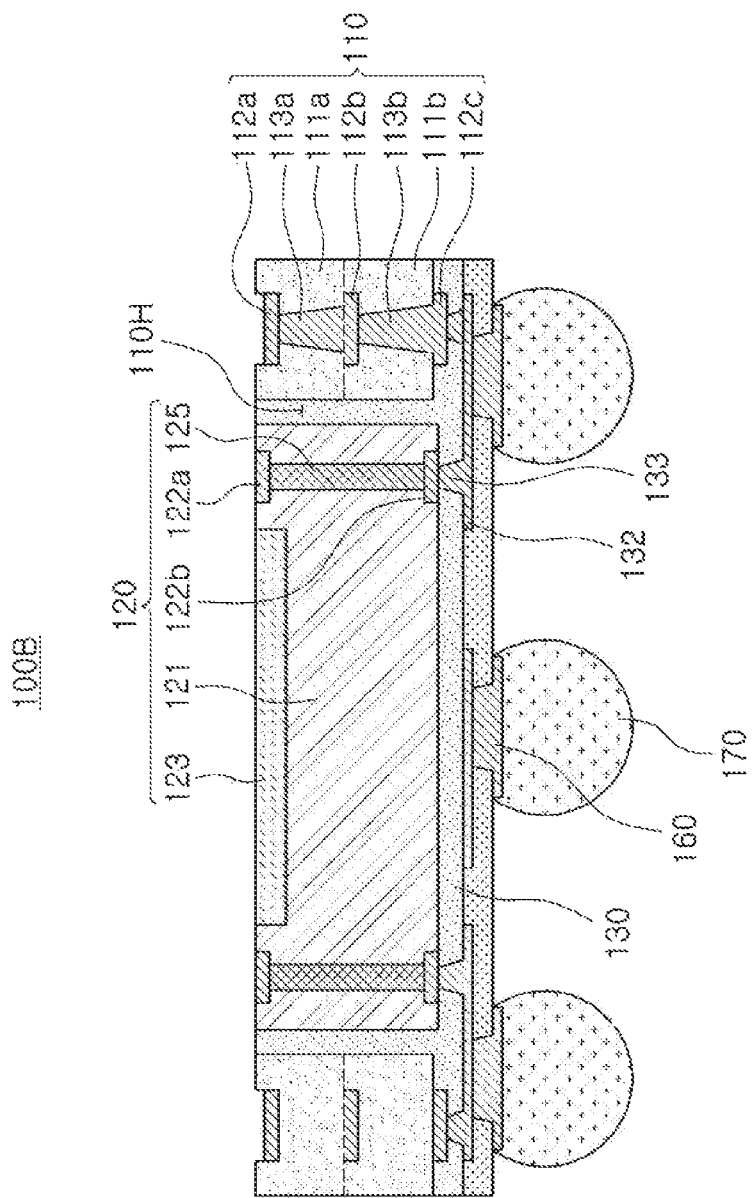
FIG. 13 is a schematic cross-sectional view illustrating another example of a fan-out sensor package.

FIG. 13 is a schematic cross-sectional view illustrating another example of a fan-out sensor package.

Referring to FIG. 13, in a fan-out sensor package 100B according to another exemplary embodiment in the present disclosure, a core member 110 may include wiring layers 112a, 112b, and 112c electrically connected to a redistribution layer 132. In detail, the core member 110 may include a first insulating layer 111a, a first wiring layer 112a embedded in the first insulating layer 111a so that an upper surface thereof is exposed, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. In addition, the core member 110 may include first vias 113a penetrating through the first insulating layer 111a and electrically connecting the first and second wiring layers 112a and 112b to each other and second vias 113b penetrating through the second insulating layer 111b and electrically connecting the second and third wiring layers 112b and 112c to each other. As described above, since the core member 110 may include a large number of wiring layers 112a, 112b, and 112c, the redistribution layer 132 may be simplified.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122b and 122c of an IC 120 for a sensor. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, electrical connection structures pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have any shape known in the related art, such as a tapered shape, and the like.

The first wiring layer 112a may be recessed into the first insulating layer 111a. That is, an upper surface of the first wiring layer 112a may have a step with respect to an upper surface of the first insulating layer 111a in FIG. 13. The second wiring layer 112b may be disposed at a level between a first surface and a second surface of the IC 120 for a sensor. A thickness of each of the wiring layers 112a, 112b, and 112c of the core member 110 may be greater than that of the redistribution layer 132. A description of other configurations, for example, a configuration in which an IC 120 for a sensor is in a three-stack type of a sensor die 121a, a logic die 121b, and a memory die 121c, and the like, overlaps that described above, and is thus omitted.

Figure 14:
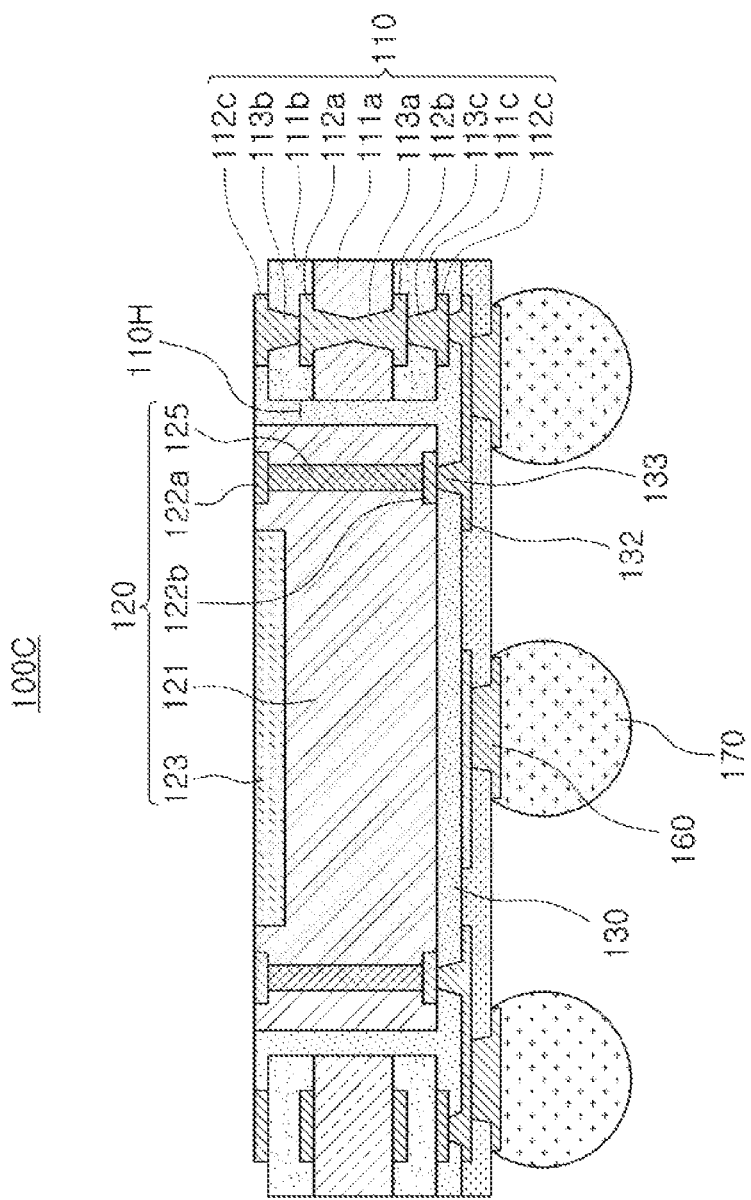
FIG. 14 is a schematic cross-sectional view illustrating another example of a fan-out sensor package.

FIG. 14 is a schematic cross-sectional view illustrating another example of a fan-out sensor package.

Referring to FIG. 14, in a fan-out sensor package 100C according to another exemplary embodiment in the present disclosure, a core member 110 may include wiring layers 112a, 112b, 112c, and 112d electrically connected to connection pads 122a and 122b of an IC 120 for a sensor. In detail, the core member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. In addition, the core member 110 may include first vias 113a penetrating through the first insulating layer 111a and electrically connecting the first and second wiring layers 112a and 112b to each other, second vias 113b penetrating through the second insulating layer 111b and electrically connecting the first and third wiring layers 112a and 112c to each other, and third vias 113c penetrating through the third insulating layer 111c and electrically connecting the second and fourth wiring layers 112b and 112d to each other. As described above, since the core member 110 may include a large number of wiring layers 112a, 112b, 112c, and 112d, a redistribution layer 132 may further be simplified.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

The first wiring layer 112a and the second wiring layer 112b may be disposed at a level between a first surface and a second surface of the IC 120 for a sensor. A thickness of each of the wiring layers 112a, 112b, 112c, and 112d may be greater than that of the redistribution layer 132. A description of other configurations, for example, a configuration in which an IC 120 for a sensor is in a three-stack type of a sensor die 121a, a logic die 121b, and a memory die 121c, and the like, overlaps that described above, and is thus omitted.

Figure 15:
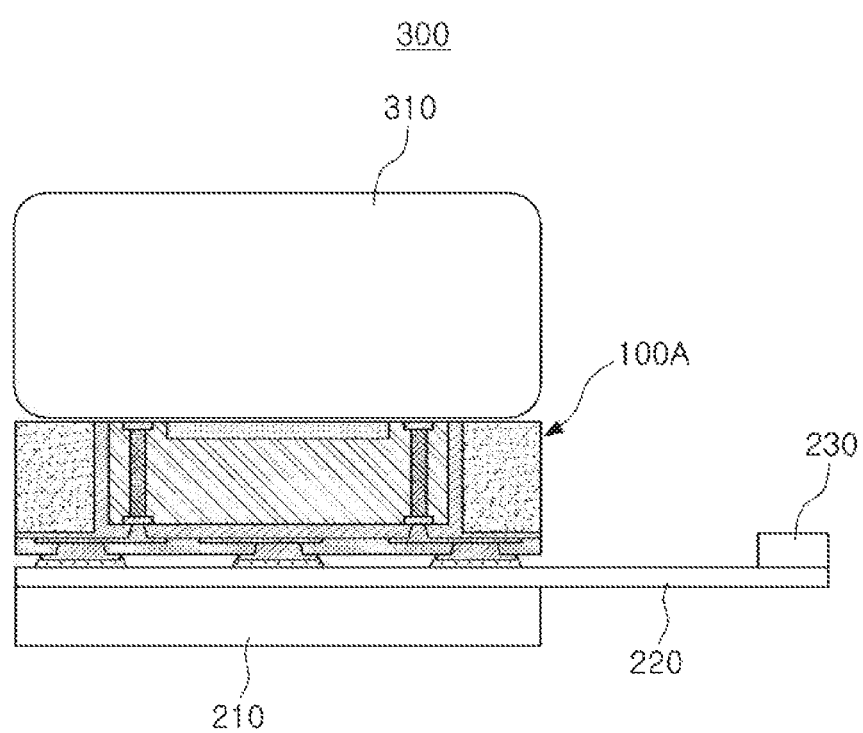
FIG. 15 is a schematic cross-sectional view illustrating an example of a camera module.

FIG. 15 is a schematic cross-sectional view illustrating an example of a camera module.

Referring to FIG. 15, a camera module 300 according to an exemplary embodiment in the present disclosure may include a support substrate 210, a circuit board 220 disposed on the support substrate 210, an image sensor package 100A (or 100B or 100C) disposed on the circuit board 220, an electronic component 230 disposed on the circuit board 220, and a lens member 310 disposed on the image sensor package 100A.

The support substrate 210 may be attached to a lower portion of the circuit board 220 through an adhesive. The support substrate 210 may support other components of the camera module 300. The support substrate 210 may prevent the circuit board 200 from being warped depending on its material. The support substrate 210 may be formed of a stainless material. However, the support member 210 is not limited thereto, but may also be formed of an insulating material. The support member 210 may also be omitted, if necessary.

The circuit board 220 may be any known printed circuit board used in the camera module, or the like. For example, the circuit board 220 may be a rigid-flexible printed circuit board (RFPCB) in which a rigid printed circuit board (RPCB) and a flexible printed circuit board (FPCB) are combined with each other. Alternatively, the circuit board 220 may be a flexible printed circuit board (FPCB). That is, when the fan-out sensor package 100A, 100B, or 100C described above is used as the image sensor package 100A, the FPCB may be used. In this case, the image sensor package 100A may be manufactured at a smaller thickness and a process of modularizing the image sensor package 100A may further be simplified, as compared to a case in which the RFPCB is used.

The image sensor package 100A may be the fan-out sensor package 100A according to the exemplary embodiment described above. However, the image sensor package 100A is not limited thereto, but may also be the fan-out sensor package 100B or 100C according to another exemplary embodiment described above.

The lens member 310 may include a lens module, a housing accommodating the lens module therein, an actuator, a ball bearing portion, a case, a control unit, and the like. The lens module may include a lens barrel and a lens holder accommodating the lens barrel therein. The lens barrel may have a hollow cylindrical shape so that a plurality of lenses capturing an image of a subject may be accommodated therein, and the plurality of lenses may be provided in the lens barrel along an optical axis. The plurality of lenses may be stacked by a required number depending on a design of the lens module, and have optical characteristics such as refractive indices that are the same as or different from each other, or the like. The lens barrel may be coupled to the lens holder. For example, the lens barrel may be inserted into a hollow included in the lens holder, and the lens barrel and the lens holder may be coupled to each other in a screwing manner or be coupled to each other by an adhesive.

The lens module may be accommodated in the housing, and be moved in an optical axis direction for auto-focusing. To this end, the actuator may be provided. The actuator may include a magnet mounted on one surface of the lens holder and a coil disposed to face the magnet in order to move the lens module in the optical axis direction. The coil may be mounted on a substrate, and the substrate may be mounted on the housing so that the coil faces the magnet. The actuator may be an optical image stabilizer (OIS), or the like, but is not limited thereto.

The coil may move the lens module in optical axis direction by electromagnetic interaction with the magnet adjacent thereto. That is, the magnet may form a magnetic field, and when power is applied to the coil, driving force may be generated by electromagnetic interaction between the magnet and the coil, and the lens module may be moved in the optical axis direction by the driving force.

The control unit may include a driver IC and a position sensor, and control an operation of the actuator. The position sensor may detect a position of the magnet to detect a position of the lens module on which the magnet is mounted. The position sensor may be disposed at the center of the coil having a doughnut shape or be disposed outside the coil. The driver IC and the position sensor may be formed integrally with each other as one element. However, the driver IC and the position sensor are not limited thereto, but may also be provided as separate elements.

When the lens module is moved in the optical axis direction in the housing, the ball bearing portion may be provided as a guide unit guiding the movement of the lens module. The ball bearing portion may include one or more ball bearings, and when a plurality of ball bearings are provided, the plurality of ball bearings may be disposed in the optical axis direction. Here, the plurality of ball bearings may be disposed to be spaced apart from each other in a direction perpendicular to the optical axis direction in relation to the magnet. The ball bearing portion may be in contact with an outer surface of the lens holder and an inner surface of the housing to guide the movement of the lens module in the optical axis direction. The ball bearing portion may be disposed between the lens holder and the housing, and may guide the movement of the lens module in the optical axis direction through a rolling motion.

A stopper may be mounted in the housing to limit a movement distance of the lens module. For example, the stopper may be mounted at an upper portion of the housing, and the stopper and the lens module may be disposed to be spaced apart from each other in the optical axis direction when power is not applied to the coil. When the lens module is moved in the optical axis direction by the power applied to the coil, the movement distance of the lens module may be limited by the stopper, and the lens module may thus be moved in an interval range between the lens module and the stopper. In addition, the stopper may be formed of a material having elasticity in order to alleviate impacts generated when the stopper and the lens barrel collide with each other.

The case may be coupled to the housing to surround an outer surface of the housing, and may serve to block electromagnetic waves generated during driving the camera module. That is, when the electromagnetic waves generated at the time of driving the camera module are emitted outwardly, the electromagnetic waves may affect other electronic components, which may cause communications errors or malfunction. The case may be formed of a metal to be grounded to a ground pad of the substrate mounted beneath the housing. Therefore, the case may block the electromagnetic waves. When the case is formed of a plastic injection molded product, a conductive paint may be applied to an inner surface of the case to block the electromagnetic waves. The conductive paint may be a conductive epoxy. That is, the conductive paint is not limited thereto, but may also be various materials having conductivity, and a conductive film or conductive tape may be attached to the inner surface of the case.

As set forth above, according to the exemplary embodiments in the present disclosure, a fan-out sensor package of which miniaturization and performance improvement are possible and in which a process of implementing a module or a device may be simplified, and a camera module including the same may be provided.

While exemplary embodiments have been shown and described above, it will be apparent to those skilled in the art that modifications and variations could be made without departing from the scope of the present invention as defined by the appended claims.

What is claimed is:

1. An IC package comprising:
an IC member in which a plurality of chips are stacked;
through-silicon vias (TSVs) penetrating the IC member and electrically connecting the plurality of chips to each other;
an encapsulant covering side surfaces and a lower surface of the IC member;
a redistribution layer disposed on a lower surface of the encapsulant;
an inter-connection member spaced apart from the IC member and having one end connected to the redistribution layer and penetrating the encapsulant; and
vias penetrating through at least portions of the encapsulant covering the lower surface of the IC member and electrically connecting the redistribution layer and the IC member to each other,
wherein at least one of the plurality of chips is an IC chip for an image sensor comprising a sensor region that is exposed through an upper surface of the IC member, and
wherein the upper surface of the IC member is substantially coplanar with an upper surface of the encapsulant and an upper surface of the inter-connection member.

2. The IC package of claim 1, wherein the plurality of chips has a stack die form in which a sensor die, a logic die, and a memory die are stacked.

3. The IC package of claim 2, wherein the sensor die, the logic die, and the memory die are sequentially stacked, and
wherein the upper surface of the IC member is one surface of the sensor die, and the lower surface of the IC member is one surface of the memory die.

4. The IC package of claim 1, wherein the upper surface of the IC member is exposed upwardly of the IC package.

5. The IC package of claim 1, wherein the IC chip for the image sensor is in a complementary metal oxide semiconductor (CMOS) image sensor (CIS).

6. The IC package of claim 1, wherein the encapsulant includes a photosensitive insulating material.

7. An IC package comprising:
an IC member in which a plurality of chips are stacked, the plurality of chips being connected to each other by through-silicon vias (TSVs);
an encapsulant covering side surfaces and a lower surface of the IC member such that an upper surface of the IC member is exposed;
a redistribution layer disposed on a lower surface of the encapsulant; and
vias penetrating through at least portions of the encapsulant and electrically connecting the redistribution layer to the IC member,
wherein at least one of the plurality of chips is an IC chip for an image sensor comprising a sensor region that is exposed through the upper surface of the IC member, and
wherein the exposed upper surface of the IC member is substantially coplanar with an upper surface of the encapsulant.

8. The IC package of claim 7, further comprising:
a passivation layer disposed on the encapsulant to cover the redistribution layer and having openings exposing at least portions of the redistribution layer; and
electrical connection structures disposed on the openings of the passivation layer and electrically connected to the exposed redistribution layer,
wherein at least one of the electrical connection structures is disposed in a fan-out region.

9. The IC package of claim 7, further comprising:
an inter-connection member surrounding the IC member and penetrating between the upper surface and the lower surface of the encapsulant.

10. The IC package of claim 7, wherein the plurality of chips has a stack die form in which a sensor die, a logic die, and a memory die are sequentially stacked.

11. The IC package of claim 10, wherein the sensor die is in a complementary metal oxide semiconductor (CMOS) image sensor (CIS).

* * * * *